United States Patent
Fujita

(10) Patent No.: US 9,082,577 B1
(45) Date of Patent: Jul. 14, 2015

(54) ADJUSTMENT METHOD FOR ELECTRON BEAM DEVICE, AND THE ELECTRON BEAM DEVICE THUS ADJUSTED

(71) Applicant: SHIMADZU CORPORATION, Kyoto-shi, Kyoto (JP)

(72) Inventor: Shin Fujita, Kyoto (JP)

(73) Assignee: SHIMADZU CORPORATION, Kyoto (JP)

( * ) Notice: Subject to any disclaimer, the term of this patent is extended or adjusted under 35 U.S.C. 154(b) by 0 days.

(21) Appl. No.: 14/459,497

(22) Filed: Aug. 14, 2014

(51) Int. Cl.
  *H01J 3/18* (2006.01)
  *H01J 3/14* (2006.01)
(52) U.S. Cl.
  CPC .......................................... *H01J 3/14* (2013.01)
(58) Field of Classification Search
  CPC .......... H01J 37/065; H01J 37/063; H01J 3/14
  USPC ....... 250/396 R, 306, 307, 310, 311
  See application file for complete search history.

(56) References Cited

U.S. PATENT DOCUMENTS

2010/0127170 A1* 5/2010 Fujita et al. ................... 250/310

FOREIGN PATENT DOCUMENTS

JP                4595778 B2        12/2010

\* cited by examiner

*Primary Examiner* — Michael Maskell
(74) *Attorney, Agent, or Firm* — Sughrue Mion, PLLC

(57) ABSTRACT

An electron beam device including an electron source which generates an electron beam; three lenses for controlling the characteristics of the electron beam, including a first lens, second lens and third lens arranged in sequence from the upstream side in relation to the emission direction of the electron beam; and a beam definition aperture arranged on the second lens. The position of the second lens is adjusted such that the total lens magnification ratio obtained under maximum beam current substantially matches the ideal lens magnification ratio defined on the basis of electro-optical characteristics.

2 Claims, 8 Drawing Sheets

US 9,082,577 B1

ADJUSTMENT METHOD FOR ELECTRON BEAM DEVICE, AND THE ELECTRON BEAM DEVICE THUS ADJUSTED

TECHNICAL FIELD

The present invention relates to an electron beam device used in the industrial field, the medical field, etc., and can be used specifically in EPMA (electron probe microanalyzer), microfocus X-ray tube, SEM (scanning electron microscope), TEM (transmission electron microscope), electron beam lithography and other devices employing an electron beam.

BACKGROUND ART

In SEM, EPMA, microfocus X-ray tube and other electron beam-employing devices which utilize an electron microprobe, focusing as large a beam current as possible on the observed sample (X-ray target) with as small a probe diameter as possible is important for increasing the S/N (signal to noise) ratio and resolution. FIG. 8 shows the lens configuration of an electron probe-forming system using a Schottky emitter. In the electron gun, an extraction electrode 12 and acceleration electrode 13 are arranged between an emitter 11 and a condenser lens 14, and a suppressor electrode (not illustrated) is arranged sandwiching the emitter 11 on the side opposite to that of the extraction electrode 12. The electron beam from the emitter 11 is controlled by the condenser lens 14, and the desired beam current is extracted using an aperture 15a placed inside diaphragm lens 15. After passing the aperture, the electron beam forms an electron probe focused on the sample (target) 17 using the diaphragm lens 15 and objective lens 16.

An important matter in forming a probe which is as small as possible at a given beam current is to focus the beam on the sample 17 at the optimal aperture angle α opt for the beam current Ib. This will be explained using formulas. The probe diameter of the electron beam obtained on the sample 17 is determined by the contributions of the electron source's Gaussian image diameter, diffraction aberration, spherical aberration and chromatic aberration. The probe diameter is generally given by the following formula.

$$d^2 = P\alpha^6 + Q\alpha^2 + R + \frac{S}{\alpha^2} \quad (1)$$

$$P = \frac{1}{8}C_s^2$$

$$Q = \frac{1}{2}C_s^2\left(\frac{\Delta E}{V_{acc}}\right)^2 + \frac{4}{\pi^4}C_sC_{sg}\left(\frac{V_{acc}}{V_{ext}}\right)^{3/2}\left(\frac{I_b}{B}\right)^2\frac{1}{d_{co}^4}$$

$$R = \frac{4}{\pi^2}C_cC_{cg}\left(\frac{\Delta E}{V_{acc}}\right)^2\left(\frac{V_{acc}}{V_{ext}}\right)^{3/2}\frac{I_b}{B}\frac{1}{d_{co}^2}$$

$$S = \frac{4}{\pi^2}\frac{I_b}{B} + \frac{(1.22\lambda)^2}{2} +$$

$$\frac{32}{\pi^2}C_{cg}^2\left(\frac{V_{acc}}{V_{ext}}\right)^2\left(\frac{I_b}{B}\right)^4\frac{1}{d_{co}^4} + \frac{8}{\pi^4}C_{cg}^2\left(\frac{\Delta E}{V_{acc}}\right)^2\left(\frac{V_{acc}}{V_{ext}}\right)^3\left(\frac{I_b}{B}\right)^2\frac{1}{d_{co}^4}$$

Here, Cs and Cc are the spherical and chromatic aberration coefficients of the objective lens, Vext and Vacc are the extraction and acceleration voltages of the electron gun, ΔE is the beam energy spread, Csg and Ccg are the spherical and chromatic aberration coefficients of the condenser lens, B is the electron beam brightness, and dco represents the diameter of the electron source. λ is the de Broglie wavelength of electrons. Formula (1) is a form of a previously known probe diameter evaluation formula extended to take into account the aberration of the electron gun section and condenser lens section. When an electron gun with a low angular current density, such as a field emission type emitter, is used as the electron source, if only the objective lens aberration is taken into account, the evaluation of probe diameter becomes inaccurate and use of formula (1) is essential.

The various coefficients of formula (1) are determined when the desired beam current Ib has been given, so there exists an aperture angle which minimizes the probe diameter d, i.e. an optimal aperture angle α opt, expressed by the following formula (2).

$$\alpha_{opt}^4 = \frac{\sqrt{Q^2 + 12PS} - Q}{6P} \quad (2)$$

It is desirable to adjust the beam aperture angle on the sample in accordance with the beam current value to the value given by formula (2).

The optical parameter of lens system total magnification ratio M (ratio between the Gaussian image diameter dg on the sample and the electron source diameter dco) is introduced in order to achieve the optimal aperture angle α opt. The total magnification ratio M can be computed based on focal distance of the lenses once their excitation intensities have been determined. Furthermore, the following relational expression obtains between the ratio between beam current and brightness (Ib/B) and the total magnification ratio M.

$$M = \frac{2}{\pi}\frac{1}{d_{co}}\sqrt{\frac{I_b}{B}}\frac{1}{\alpha_{opt}} \quad (3)$$

The dependence of optimal aperture angle α opt on beam current is always there in the form of a ratio to brightness, (Ib/B), so if the parameter t=Ib/B is defined, the total magnification ratio M and the aperture angle α opt can both be expressed as a function of t.

$$M=M(t) \; \alpha_{opt}=\alpha_{opt}(t) \quad (41)$$

Optimal aperture angle control can thus be achieved if the combination of total magnification ratio and optimal aperture angle (M, α opt) moves along the ideal "operating curve" given by formula (4) when the beam current is changed. "Lens system total magnification ratio" and "beam aperture angle" are both operating parameters which can be unambiguously calculated based on lens arrangement and lens strengths, making it possible to place the beam conditions on the operating curve without dependency on parameters that depend on the operating state of the electron gun, such as beam current and beam brightness, which were necessary in the prior art.

FIG. 2 shows an example of the determination of operating curve (M, α opt) for the system shown in FIG. 8. It can be seen that the beam aperture angle α opt should be constant in the region where beam current Ib is small and should increase proportionally to about the (⅓) power of total magnification ratio M in the middle region. In the large beam current region, it is necessary to increase the current by increasing the beam aperture angle α opt while keeping the total magnification ratio M constant. The total magnification ratio M in the large beam current region where total magnification ratio M becomes constant is referred to as asymptotic total magnification ratio Masymp. Using the parameters appearing in formula (1), this asymptotic total magnification ratio Masymp is given by the following (see Non-patent literature 1):

$$M_{amp}=1.3161(V_{ext}/V_{acc})^{3/8}(C_s/C_{sg})^{1/4} \quad (5)$$

FIG. 3 shows an example of evaluation in which the probe property (relationship between beam current Ib and probe diameter d on the sample) has been determined for when the excitation conditions of the lens system correspond to the operating curve, i.e. when an optimal beam aperture angle has been achieved. The figure illustrates the typical probe property when using a Schottky emitter electron gun, which is one kind of field emission type emitter, and shows that the probe diameter is essentially constant regardless of current when the beam current is small, increases gradually with current in the middle region, and increases sharply at $d \propto Ib^{3/2}$ when a certain beam current threshold is exceeded. This corresponds to how the control of the optimal aperture angle α opt shown in FIG. 2 differs according to the beam current region (see Patent literature 1).

PRIOR ART LITERATURES

Patent Literatures (Patent literature 1) Japanese Patent No. 4595778
(Non-patent literature 1) FUJITA, Makoto. Dissertation. Meijo University (2007)

SUMMARY OF THE INVENTION

Problem to be Solved by the Invention

The combination of total magnification ratio and beam aperture angle (M. α) (where a is not necessarily limited to the optimal value) can be determined as a function of excitation strength of each lens. FIG. 4 shows an example where total magnification ratio M and beam aperture angle α were calculated as a function of two variables—condenser lens excitation strength NIcl and diaphragm lens excitation strength NIiris (diaphragm diameter is assumed to be fixed), and based on that, the combination of lens excitation strengths (NIcl, NIiris) corresponding to the operating curve (M. α opt) was determined.

To implement an operating curve (M, α opt), strictly speaking, it should be necessary to adjust the diaphragm lens strength NIiris each time according to the condenser lens strength NIcl. In actuality, it is shown that except for the region where the beam current is extremely large (for example, 1080 AT<NIcl), the strength of the diaphragm lens can be essentially constant. This is a generally applicable fact. Under conditions where beam current becomes extremely large, for example, 1080 AT<NIcl, it is necessary to subtly alter the diaphragm lens strength NIiris according to the condenser lens strength NIcl. In particular, under conditions where cross-over due to the condenser lens is formed near the aperture (maximum beam current condition), the diaphragm lens setting diverges greatly from other cases. This complicates the control of the lens system.

It is an object of the present invention to facilitate the control of the lens system under conditions where the beam current becomes extremely large.

Means for Solving the Problem

The reason it is necessary to greatly change the diaphragm lens excitation in case of large beam current in the lens system of FIG. 8 is that there is no coordination between the lens arrangement and the asymptotic total magnification ratio Masymp determined when the beam current shown in FIG. 2 is large. FIG. 5 schematically illustrates the lens operation when securing a large beam current. In the three-stage lens system to which the present invention applies, as shown by the dashed line in FIG. 5, the maximum beam current is obtained in a state where the condenser lens 14 forms a crossover on the aperture arranged in diaphragm lens 15. It is thought that beam operation close to this occurs under conditions where large beam current is obtained. In other words, the configuration is such that the lens magnification ratio under large beam current conditions is fixed by the lens configuration. If this differs greatly from the Masymp of the operating curve, the load on the diaphragm lens will increase and control of the optimal beam aperture angle will become difficult.

Thus, in the present invention, the load on the diaphragm lens is reduced by arranging the diaphragm lens such that the total magnification ratio M under large beam current conditions substantially matches the asymptotic total magnification ratio Masymp. The term "substantially matches" means not just cases of complete match but also that some divergence is permitted. When this condition is satisfied, it is possible to make the actually obtained operating curve (M, α) close to the ideal operating curve (M, α opt) without adjusting the diaphragm lens strength NIiris each time according to the condenser lens strength NIcl, i.e. while keeping the diaphragm lens strength constant.

With the electron beam device adjustment method of the present invention, the diaphragm lens arrangement is optimized by the following means.

1) The ideal operating curve (FIG. 2) is calculated on the basis of the optical characteristics (aberration coefficient, etc.) of the electron gun section and objective lens.
2) The positioning of the diaphragm lens, i.e. the distance a2 from the diaphragm lens to the condenser lens and the distance b1 from the diaphragm lens to the objective lens, is adjusted so that the total lens magnification ratio, under beam conditions of maximum beam current shown in FIG. 5, substantially matches the asymptotic magnification ratio Masymp (see formula (5)) under large beam current conditions of the operating curve. To be more specific, the lens total magnification ratio M under maximum beam current acquisition, as shown by the dashed line in FIG. 5, is determined by:

$$M=(a_2/a_1)(b_2/b_1) \quad (6)$$

The above formula indicates that the total magnification ratio M here is determined solely by the lens positioning. Since Masymp is given by the operating curve, the lens positioning (a2, b1) is adjusted so as to achieve M Masymp (M is substantially equal to Masymp). The term "M is substantially equal to Masymp" signifies not only cases where M is equal to Masymp but also that these may diverge somewhat.
3) The diaphragm diameter and diaphragm lens excitation are adjusted so that the actual operating curve approaches the ideal curve as much as possible, as shown in FIG. 6. FIG. 6 illustrates what happens to the operating curve which is actually obtained when, for example, the diaphragm lens excitation is changed. Here, it is calculated how the magnification ratio M and beam aperture angle α move when the excitation of the diaphragm lens is kept constant and only the condenser lens excitation strength is changed. In terms of FIG. 4, this illustrates the corresponding combinations of (M, α) on the horizontal line when NIiris is kept constant.

FIG. 6 (a) shows the results for when the diaphragm lens excitation strength is adjusted and an actual operating curve (M, α) (squares) close to the ideal operating curve (M, α opt) (diamonds) is obtained. If the excitation strength of the diaphragm lens is greater than the optimal value, the actual operating curve will be as shown in FIG. 6 (b). Here, the beam aperture angle α will become greater than the optimal aperture angle α opt which should be achieved at each total magnification ratio M. Conversely, if the diaphragm lens excitation strength is too low, the beam aperture angle will become smaller than the optimal value, as shown in FIG. 6 (c).

In this way, with the diaphragm lens excitation being kept constant, while it is not possible to strictly achieve the optimal beam aperture angle for all magnification rates, it is possible to eliminate regions of major deviation by selecting a suitable excitation strength.

If 1) through 3) are satisfied, a nearly ideal probe characteristic can be achieved by performing beam current adjustment just by modifying the condenser lens excitation, while keeping the diaphragm lens excitation and aperture diameter fixed. It should be noted that objective lens excitation needs to be suitably adjusted so as to achieve focus on the sample.

The present invention also includes an electron beam device comprising a diaphragm lens whereof the arrangement has been adjusted in this manner.

Effect of the Invention

The results of estimation of the probe property for the lens system shown in FIG. 5, obtained when the diaphragm lens positioning is adjusted in order to match the total magnification ratio, are shown in FIG. 6 (a) and FIG. 7. FIG. 6 (a) is an operating curve. The curve shown by the diamonds represents the ideal operating curve (M, α opt), and the curve shown by the squares indicates the actual operating curve (M, α) obtained under "diaphragm lens excitation strength=constant." To obtain the actual operating curve, the diaphragm lens position is optimized by adjustment of (a2, b1) in FIG. 5, and the diaphragm lens excitation is adjusted so that the aperture angle α comes close to the ideal operating curve.

With an actual operating curve (M, α) subject to the constraint "diaphragm lens excitation strength=constant," it is not possible to faithfully follow the ideal operating curve (M, α opt). In the small beam current region and medium beam current region, the aperture angle α will be a value that deviates somewhat from the optimal value. To see the effect of this on the probe property, numerical simulation evaluation results under ideal (optimal beam aperture angle conditions) and actual conditions (conditions of diaphragm lens excitation=constant) have been shown in FIG. 7. The curve shown by the diamonds, just as with the operating curve, corresponds to ideal conditions, and the curve shown by the squares corresponds to actual conditions.

It can be seen from the computation results that the effect of the beam aperture angle deviating from the optimal value is limited. By optimizing the positioning of the diaphragm lens, even with the constrained conditions of "fixed aperture" and "fixed diaphragm lens excitation," it becomes possible to vary the beam current Ib over a wide range from approximately 100 pA to approximately 10 μA, without harming the probe property, simply by changing the condenser lens excitation.

DETAILED DESCRIPTION OF THE EXEMPLARY EMBODIMENTS

An example of embodiment will be described, taking the example of an X-ray tube used in SEM, EPMA, microfocus X-ray tube, etc.

Figure 1:
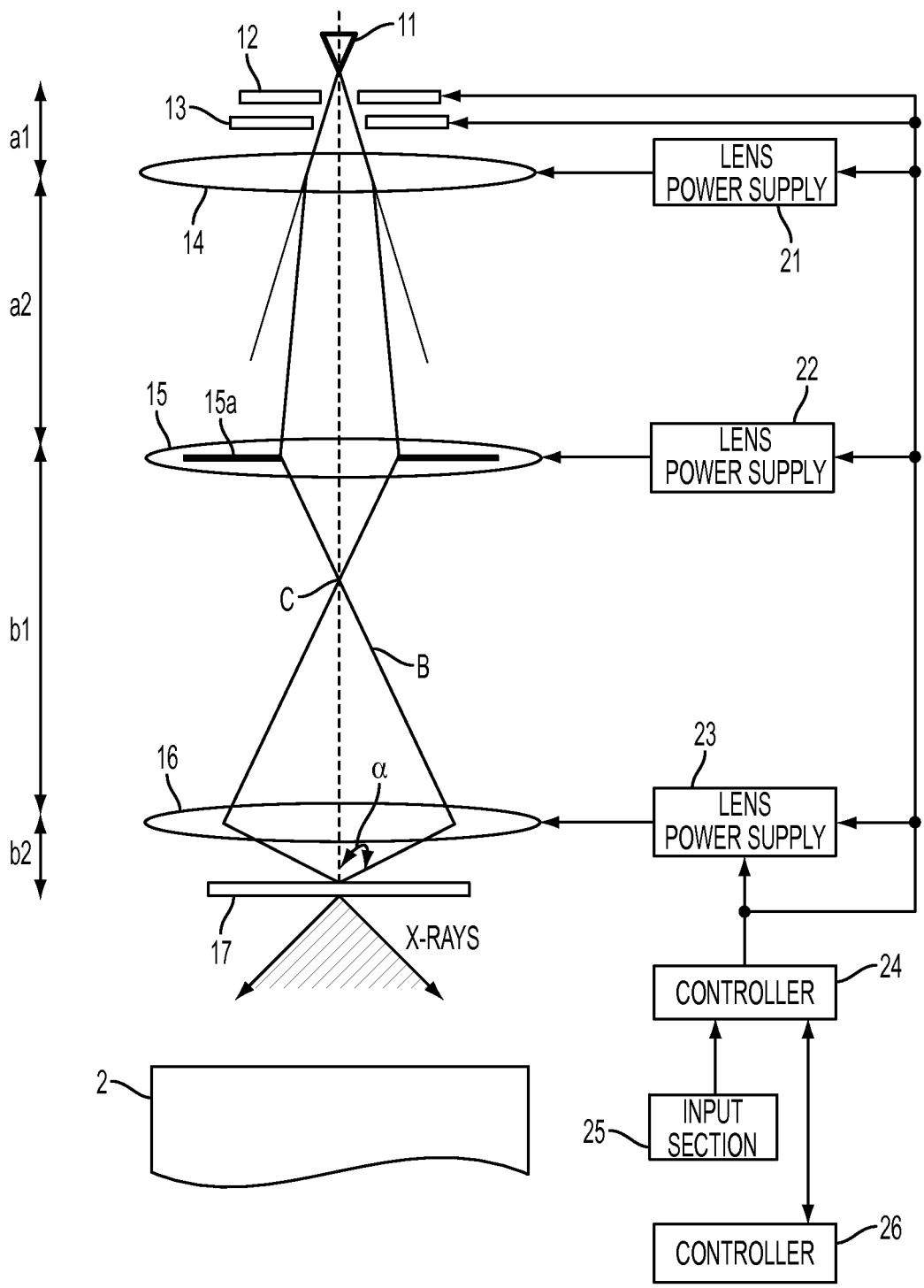
FIG. 1 is a simplified diagram illustrating an X-ray imaging device of one example of embodiment.
Figure 2:
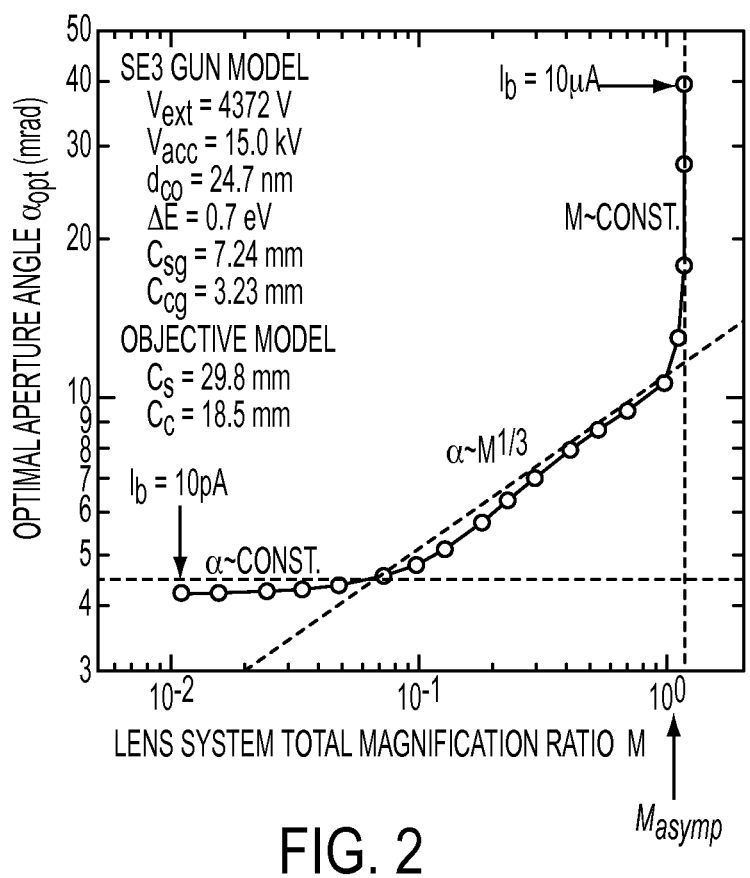
FIG. 2 is a graph showing the ideal operating curve which represents the relationship between the total magnification ratio M and the optimal beam aperture angle α opt in a three stage lens system electron beam device.

FIG. 1 shows an X-ray imaging device in which this sort of X-ray tube is used. X-ray imaging devices are used as X-ray nondestructive testing instruments and the like.

This X-ray imaging device comprises an X-ray tube 1 and an X-ray detector 2 which detects X-rays emitted from the X-ray tube 1. The X-ray detector 2 is, for example, an image intensifier (II) or flat panel X-ray detector (FPD). The X-ray detector 2 detects X-rays emitted from the X-ray tube 1, whereby an X-ray image is captured based on the detected X-rays.

X-ray tube 1 comprises, as an electron gun, an emitter 11; an extraction electrode 12 which applies a positive voltage in order to create a strong electric field; a suppressor electrode (not illustrated) which is placed on the side opposite of the emitter 11 from the extraction electrode 12 and applies a negative voltage; and an acceleration electrode 13 which applies a positive voltage in order to accelerate the electron beam B extracted by the extraction electrode 12. The emitter 11 is for example a field emission type emitter. The extraction electrode 12, suppressor electrode and acceleration electrode 13 are connected to a controller 24, whereby the respective applied voltages are controlled.

To control the characteristics of the electron beam B, three lenses, consisting of a first lens i.e. condenser lens 14, a second lens i.e. diaphragm lens 15 and a third lens i.e. objective lens 16, are provided in sequence starting from the upstream side (emitter 11 side) in relation to the emission direction of the electron beam B. A target 17 which generates X-rays upon collision of the electron beam B is provided downstream of the objective lens 16.

A lens power supply 21 for supplying current to the condenser lens 14 is connected to the condenser lens 14, a lens power supply 22 for supplying current to the diaphragm lens 15 is connected to the diaphragm lens 15, and a lens power supply 23 for supplying current to the objective lens 16 is connected to the objective lens 16. A controller 24 is connected to lens power supplies 21, 22 and 23 in order to control the amount of current supplied from the lens power supplies 21, 22 and 23 to the respective lenses 14, 15 and 16.

A strong electric field is created between the suppressor electrode and the extraction electrode 12, electrons are caused to be emitted from the emitter 11 using the tunnel effect and Schottky effect, and are extracted to the target 17 side as an electron beam B. The extracted electron beam B is accelerated by the acceleration electrode 13, and is radiated toward the target 17.

The condenser lens 14, diaphragm lens 15 and objective lens 16 are each fashioned in an annular shape, and an aperture 15a having an aperture hole which limits the electron beam B is arranged on the diaphragm lens 15. A magnetic field is generated in each lens 14 through 16 by current flowing from the lens power supplies 21 through 23, and the characteristics of the electron beam B are controlled in the same manner as with an optical lens. Specifically, the lenses 14 through 16 control characteristics such as the focal distance, the crossover position at which the electron beam B initially forms an image and the aperture angle α of the electron beam B when it strikes the target 17 by changing current, i.e. excitation strength. In addition to excitation strengths of the lenses 14 through 16, the characteristics of the electron beam B are also controlled by the diameter of the aperture 15a, the lens arrangement with which the lenses 14 through 16 are disposed, etc.

The target 17 consists of material which generates X-rays, as typified by tungsten and the like. The x-rays are generated due to collision of the electron beam B with the target 17.

The controller 24 comprises an input unit 25 and a memory unit 26 and performs overall control of the various components within the X-ray tube 1. Specifically, it performs control of the voltages applied to the suppressor electrode, extraction electrode 12 and acceleration electrode 13, and control of determination of the excitation strength by the supply of current from the lens power supplies 21 through 23 to the lenses 14 through 16. The controller 24 consists of a CPU (central processing unit) and the like.

Input unit 25 comprises a pointing device, as typified by a mouse, keyboard, joystick, trackball or touch panel. Overall control of the elements within the X-ray tube 1 is effected by the controller 24 based on input data inputted through the input unit 25. Specifically, upon input of operating parameters, the controller 24 determines the excitation strength of the lenses 14, 15 on the operating curve as described above. The controller 24 controls the lenses 14 and 15 by determining the excitation strength. The controller 24 performs control so that crossover C is formed between the diaphragm lens 15 and objective lens 16, without forming any cross-over between the condenser lens 14 and the diaphragm lens 15.

Memory unit 26 has the function of writing and storing various data sent in via controller 24, and reading it out if necessary. Memory unit 26 comprises a storage medium, etc., as typified by ROM (read-only memory), RAM (random access memory) or the like.

Figure 3:
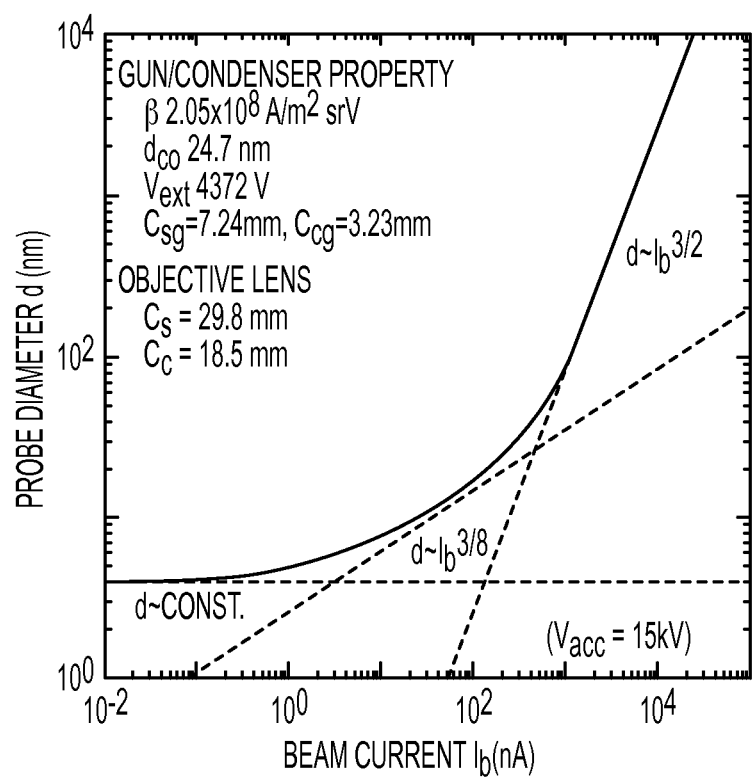
FIG. 3 is a graph showing a probe property representing the relationship between beam current Ib and probe diameter d on a sample when the optimal beam aperture angle α opt is achieved in the same electronic beam device as in FIG. 2.
Figure 4:
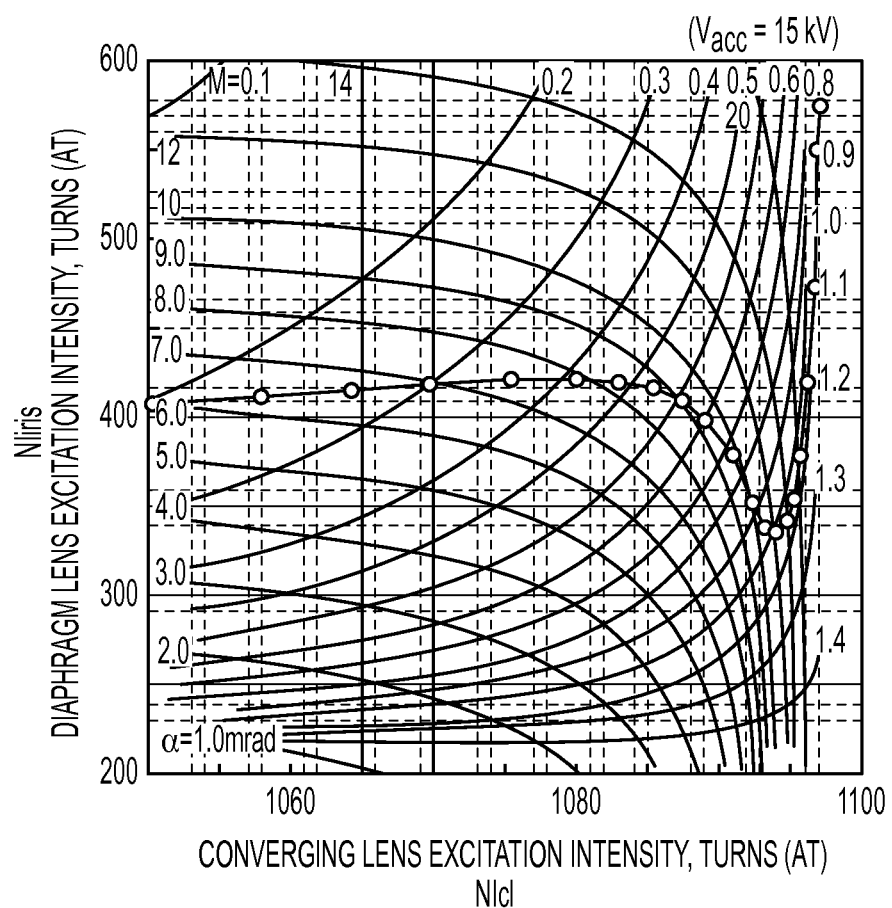
FIG. 4 is a graph representing combinations of lens excitation strengths, NIcl and NIiris, corresponding to the operating curve (M, α opt).
Figure 5:
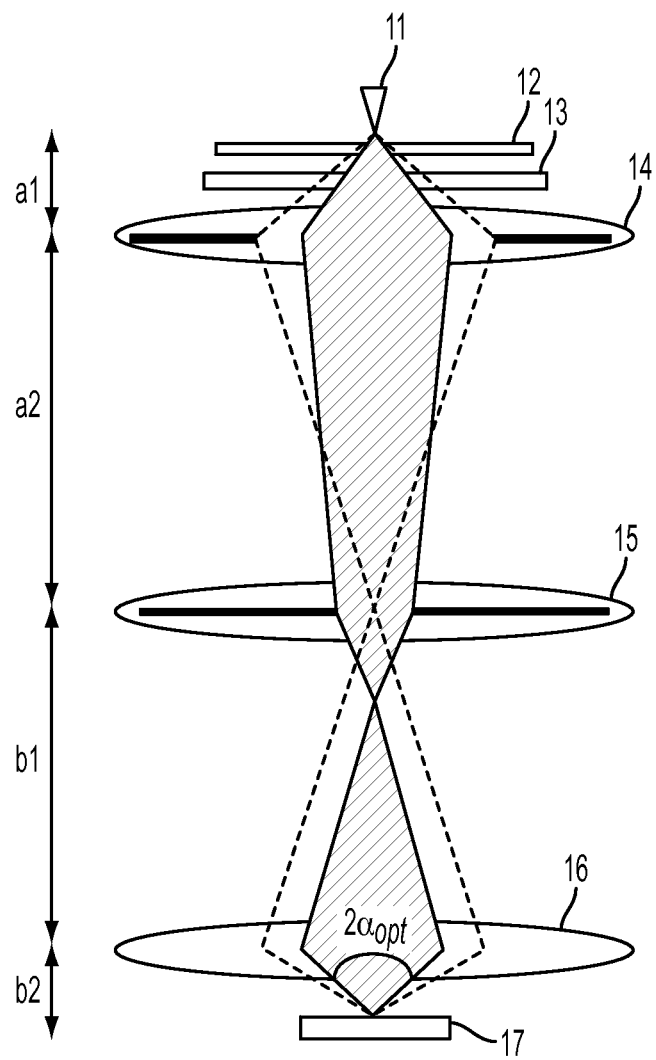
FIG. 5 is a drawing which schematically illustrates the lens operation when securing a large beam current.
Figure 6:
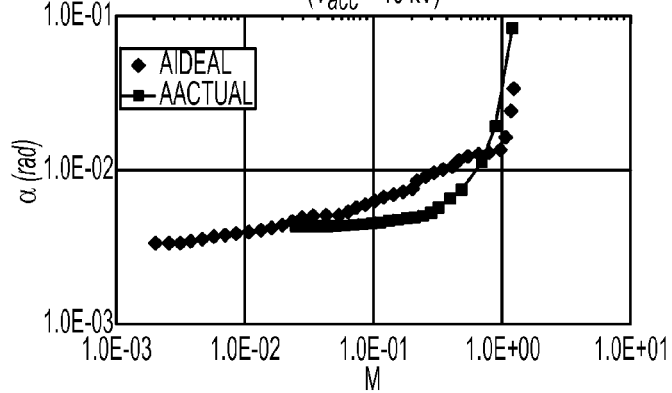
FIG. 6 is graphs showing an ideal operating curve and actual operating curve.
Figure 6:
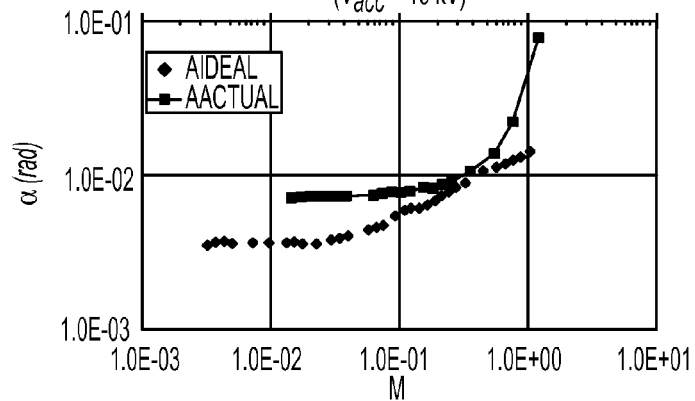
Figure 6:
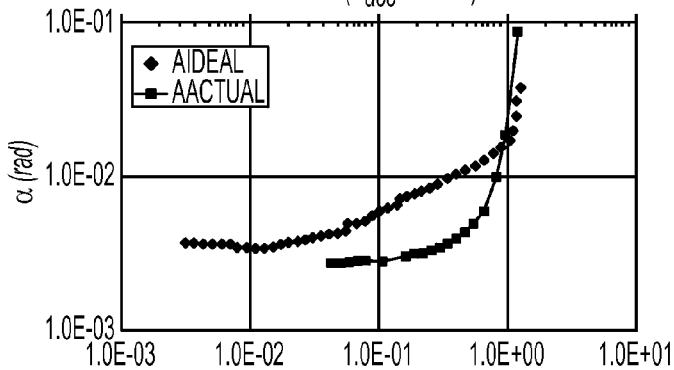
Figure 7:
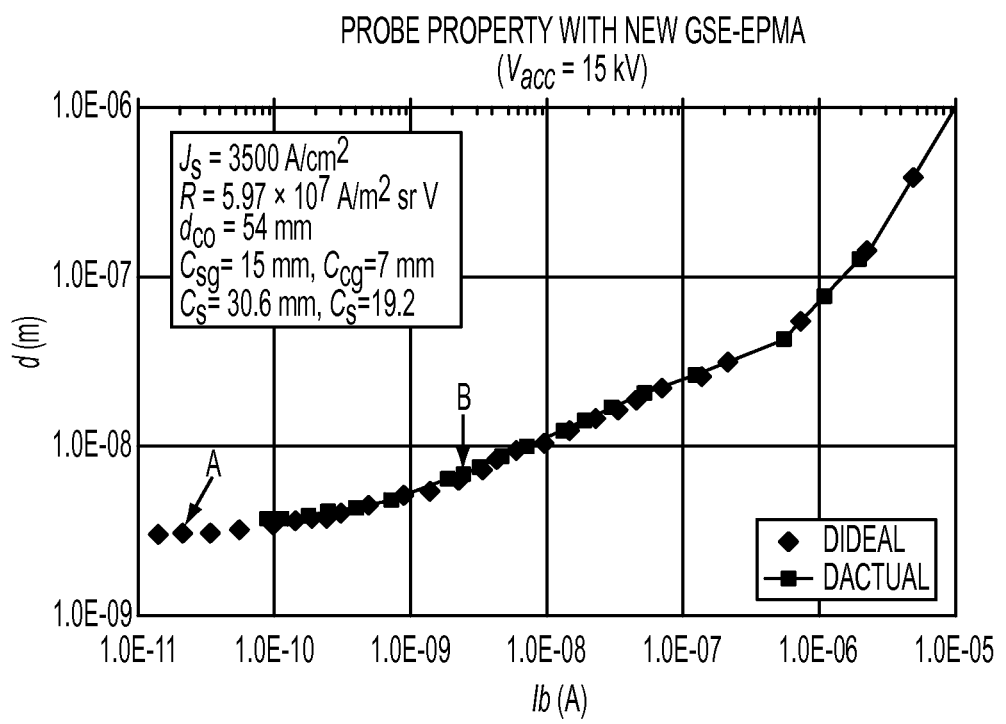
FIG. 7 is a graph showing a probe property under optimal beam aperture angle conditions and actual conditions.
Figure 8:
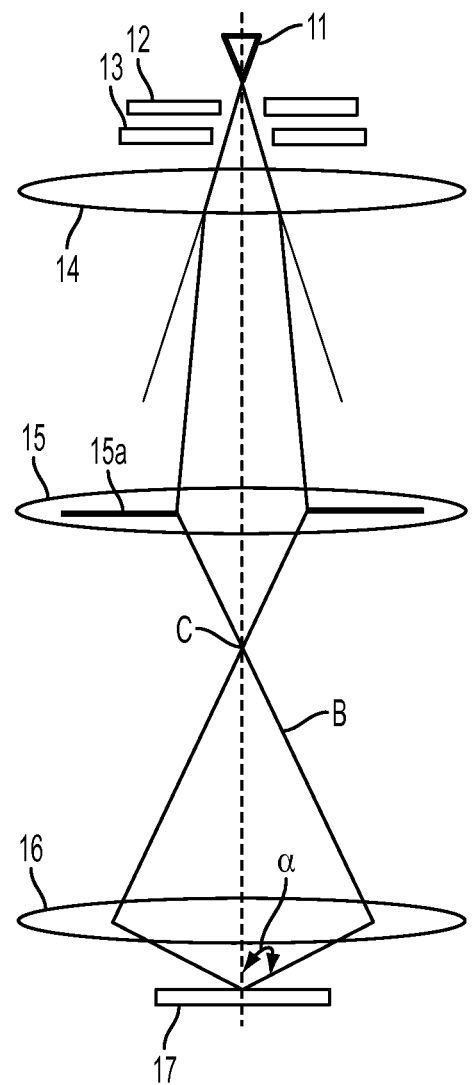
FIG. 8 is a simplified diagram showing the lens configuration of a three stage lens system electron beam device.

In FIG. 1, a1 is the distance from the emitter 11 to the condenser lens 14; a2 is the distance from condenser lens 14 to diaphragm lens 15; b1 is the distance from diaphragm lens 15 to objective lens 16; and b2 is the distance from objective lens 16 to target 17. In the present example of embodiment, the position of the diaphragm lens 15 is adjusted such that the total lens magnification ratio under beam conditions of maximum beam current shown in FIG. 3 will substantially match the asymptotic magnification ratio Masymp under large beam current conditions of the ideal operating curve. Namely, the lens distance (a2, b1) is adjusted such that M=(a2/a1)(b2/b1) will be substantially Masymp.

EXPLANATION OF REFERENCES

1 X-ray tube
2 X-ray detector
11 Emitter
12 Extraction electrode
13 Acceleration electrode
14 Condenser lens
15 Diaphragm lens
15a Aperture
16 Objective lens

What is claimed is:

1. An adjustment method for an electron beam device comprising an electron source which generates an electron beam; three lenses for controlling the characteristics of the electron beam, comprising a first lens, second lens and third lens arranged in sequence starting on the upstream side in the electron beam emission direction; and a beam definition aperture arranged on said second lens, the adjustment method comprising:
   adjusting a position of the second lens such that a total lens magnification ratio obtained under maximum beam current will substantially match an ideal lens magnification ratio specified on the basis of electro-optical characteristics.

2. An electron beam device, comprising:
   an electron source which generates an electron beam;
   three lenses for controlling the characteristics of the electron beam, comprising a first lens, second lens and third lens arranged in sequence starting on the upstream side in the electron beam emission direction; and
   a beam definition aperture arranged on said second lens,
   wherein the position of said second lens is adjusted such that the total lens magnification ratio obtained under maximum beam current will substantially match the ideal lens magnification ratio specified on the basis of electro-optical characteristics.

* * * * *